US008278666B1

(12) United States Patent
Singh et al.

(10) Patent No.: US 8,278,666 B1
(45) Date of Patent: Oct. 2, 2012

(54) METHOD AND APPARATUS FOR GROWING HIGH PURITY 2H-SILICON CARBIDE (75) Inventors: Narsingh B. Singh, Ellicott City, MD (US); Sean R. McLaughlin, Severn, MD (US); Thomas J. Knight, Silver Spring, MD (US); Robert M. Young, Ellicott, MD (US); Brian P. Wagner, Baltimore, MD (US); David A. Kahler, Halethorpe, MD (US); Andre E. Berghmans, Woodstock, MD (US); David J. Knuteson, Ellicot City, MD (US); Ty R. McNutt, Columbia, MD (US); Jerry W. Hedrick, Jr., Arnold, MD (US); George M. Bates, Burke, VA (US); Kenneth Petrosky, Severna Park, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 168 days.

(21) Appl. No.: 12/821,877

(22) Filed: Jun. 23, 2010

Related U.S. Application Data (63) Continuation of application No. 12/567,607, filed on Sep. 25, 2009, now abandoned.

(51) Int. Cl.
H01L 29/15 (2006.01)
H01L 31/0312 (2006.01)
(52) U.S. Cl. ............. 257/77; 257/64; 257/E21.049; 257/E21.065; 438/488; 438/503; 117/93; 117/105; 148/33
(58) Field of Classification Search .......... 257/51, 257/64, 65, 76, 77, E21.041, E21.049, E21.054, 257/E21.065, E21.28, E21.27; 438/488, 438/489, 503, 931, FOR. 260; 117/88, 89, 117/90, 94, 95, 929, 951
See application file for complete search history.

(56) References Cited

U.S. PATENT DOCUMENTS

| 4,517,305 | A | 5/1985 | Suzuki et al. |
| 6,022,115 | A | 2/2000 | Borra et al. |
| 7,371,282 | B2 | 5/2008 | Singh et al. |
| 2003/0047129 | A1* | 3/2003 | Kawahara et al. ......... 117/2 |
| 2004/0079989 | A1* | 4/2004 | Kaneko et al. ......... 257/328 |
| 2005/0199882 | A1* | 9/2005 | Sankin et al. ......... 257/77 |
| 2007/0221122 | A1* | 9/2007 | Kitaoka et al. ......... 117/951 |
| 2008/0011223 | A1* | 1/2008 | Singh et al. ......... 117/104 |

FOREIGN PATENT DOCUMENTS

| EP | 0 473 866 A2 | 3/1992 |
| EP | 2 113 790 A1 | 11/2009 |
| JP | 01 161107 A | 6/1989 |

OTHER PUBLICATIONS

European Search Report for corresponding EP 10 15 3957 completed May 31, 2010.

* cited by examiner

Primary Examiner — Olik Chaudhuri
Assistant Examiner — Quovaunda V Jefferson
(74) Attorney, Agent, or Firm — Tarolli, Sundheim, Covell & Tummino LLP (57) ABSTRACT The disclosure relates to a high purity 2H-SiC composition and methods for making same. The embodiments represented herein apply to both thin film and bulk growth of 2H-SiC. According to one embodiment, the disclosure relates to doping an underlying substrate or support layer with one or more surfactants to nucleate and grow high purity 2H-SiC. In another embodiment, the disclosure relates to a method for preparing 2H-SiC compositions by nucleating 2H-SiC on another SiC polytype using one or more surfactants. The surfactants can include AlN, Te, Sb and similar compositions. These nucleate SiC into disc form which changes to hexagonal 2H-SiC material.

29 Claims, 13 Drawing Sheets

METHOD AND APPARATUS FOR GROWING HIGH PURITY 2H-SILICON CARBIDE

RELATED APPLICATIONS

This application is a continuation of application Ser. No. 12/567,607, which was filed 25 Sep. 2009 now abandoned and titled "METHOD AND APPARATUS FOR GROWING HIGH PURITY 2H-SILICON CARBIDE." The entire contents of that application are hereby incorporated by reference.

BACKGROUND

1. Field of the Invention

The disclosure relates to a method and apparatus for providing high purity stable 2H silicon carbide. More specifically, the disclosure relates to a method and apparatus for growing silicon carbide at temperatures well below melting temperature of silicon.

2. Description of Related Art

Silicon Carbide ("SiC") has become an important wide bandgap semiconductor material because of its excellent properties for high power microwave devices. SiC now competes with GaAs and pure silicon in terms of gain, power output and efficiency at X-band. SiC promises even better performance at the higher frequencies (i.e., Ka and Ku-bands). Broadband power RF transmitters are needed with high efficiency, high linearity and low noise for transceiver modules. Silicon carbide crystallizes in more than 200 different modifications or polytypes. The most important polytypes are the so-called 2C, 4H and 6H, where "C" denotes cubic and "H" denotes hexagonal crystalline shape. Commercially available 4H- and 6H-SiC are mixture of cubic and hexagonal SiC crystals. As used herein, the terms 2H crystalline SiC and hexagonal SiC are interchangeable since 2H-SiC is pure hexagonal crystals.

The material attributes of SiC makes it particularly desirable for constructing communication and power devices. Such attributes include a relatively wide bandgap, a high thermal conductivity, high breakdown field strength and a high electron saturation velocity. SiC is commonly used in the bipolar junction transistors ("BJT") and the Schottky diodes. BJTs are defined by two back-to-back p-n junctions formed in a semiconductor material. In operation, current enters a region of the semiconductor material adjacent one of the p-n junctions called the emitter. Current exists the device from a region of the material adjacent the other p-n junction, called the collector. The collector and the emitter have the same conductivity type. A thin layer of semiconductor material, called the base, is positioned between the collector and the emitter. The base has opposite conductivity to the conductor and the emitter. High purity 2H-SiC has been found to be advantageous for use in bipolar junction transistors.

Similarly, diodes made of 4H SiC have been known to rapidly degrade and exhibit a growth of stacking faults under a forward bias application. In contrast, diodes made of 6H-SiC have been substantially less likely to degrade under a similar forward bias. Thus, high purity 6H-SiC have been advantageous over the 4H-SiC for such applications.

2H-SiC defines a novel class of SiC with wide bandgap material for broad applications. 2H-SiC can be used to make superior SiC devices in comparison to those fabricated from 4H- and 6H-SiC polytypes. This is due to the superior material properties of 2H in comparison with 4H and 6H. Due to difficulties in the growth of 2H, it is not offered commercially.

Conventional static induction transistors (SITs), Schottky diodes and metal semiconductor field-effect transistors ("MESFETs") use 4H-SiC as it provides high bandwidth and high thermal conductivity. The SITs have been used for high frequency and high power applications. Since 4H-SiC has a large breakdown voltage and high thermal conductivity, it is used for making transistors with extremely high current density at high voltages. For other classes of MESFET devices, mobility and bandgap are important which makes 2H-SiC more suitable. Table 1 tabulates the physical and electrical characteristics of various SiC films.

TABLE 1

| Polytype | Bandgap (eV) | Mobility @ $1 \times 10^{17}$ cm$^{-3}$ (cm$^2$/Vs) | Sat. Elec. Velocity (Cm/S) |
|---|---|---|---|
| 2H-SiC | 3.35 | 740 | $2.6 \times 10^7$ |
| 4H-SiC | 3.28 | 560 | $1.9 \times 10^7$ |
| 6H-SiC | 3.08 | 330 | $4.6 \times 10^7$ |

Another important aspect of 2H-SiC is its crystal structure and its advantages in relation to defect formation. 6H- and 4H-SiC are 33% and 50% cubic, respectively. In contrast, 2H-SiC is 100% hexagonal and 0% cubic. With 2H being a purely hexagonal structure, this could minimize the formation of stacking faults, edge, screw and mixed defects. Such defects are deleterious to device performance.

The conventional processes for preparing SiC result in polytypes of SiC, including 4H- and 6H-SiC. The conventional methods also require high-temperature processing of silicon carbide which creates defects in the final product, particularly 2H-SiC. Thus, conventional processes are not suitable for large scale manufacturing of 2H-SiC and there is a need for a method and apparatus for providing high mobility SiC for use in power devices in which 2H-SiC comprises more than 90%, preferably more than 98% and even more preferably about 100% of the SiC composition.

SUMMARY

The disclosure relates to a high purity 2H-SiC composition and methods for making same. The embodiments represented herein apply to both thin film and bulk growth of 2H-SiC. According to one embodiment, the disclosure relates to doping an underlying substrate or support layer with one or more surfactants to nucleate and grow high purity 2H-SiC. In another embodiment, the disclosure relates to a method for preparing 2H-SiC compositions by nucleating 2H-SiC on another SiC polytype using one or more surfactants. The surfactants can include one or more grains in a solid solution with the 4H- or 6H-SiC.

The methods for preparing substantially pure 2H-SiC can be done at high temperature and at low temperature. The high temperature process is implemented at the temperature range of about 1,700-2,000° C. The low temperature process is conducted at 1200° C. or less, and preferably at a temperature range of about 950-1050° C. In the high temperature processes, physical vapor deposition ("PVD") or physical vapor transport ("PVT") processes are preferable. For low temperature growth processes, chemical vapor deposition ("CVD") or chemical vapor transport ("CVT") are preferable.

According to one embodiment, a high temperature PVT process uses one or more surfactants such as AlN, Te or Sb to nucleate as hexagonal material. Thereafter, 2H-SiC is grown over the nucleated layer by introducing one a precursor containing silicon in the PVD or PVT deposition chamber.

A low temperature process for preparing substantially hexagonal SiC includes the steps of: (i) providing a substrate; (ii)

forming an intermediate layer having substantially a hexagonal structure; (iii) growing a first 2H-SiC layer over the intermediate layer at a temperature of less than 1200° C.; and (iv) growing a second 2H-SiC layer over the first 2H-SiC layer at a temperature less than about 950° C. The first 2H-SiC layer can have a thickness of about 600 Å. In one embodiment of the invention, at least one of the first or the second SiC layers contains about 95% 2H-SiC. In another embodiment, at least one of the first or the second SiC layers contains about 98% 2H-SiC. In still another embodiment, the SiC layers contain about 100% 2H-SiC. The ratio of AlN to SiC can be in the range of about 2-15 wt %, or preferably, 2-10 wt %.

In still another embodiment, the disclosure relates to a semiconductor structure having a pure hexagonal SiC structure, the composition prepared by a process comprising the steps of: at a deposition chamber, depositing a first metal layer on a silicon substrate, the first layer having a material of hexagonal structure; heating the deposition chamber to a temperature not exceeding 1200° C.; providing a first precursor containing an SiC composition to the deposition chamber and growing a first layer of 2H-SiC at a first rate; providing a second precursor containing an SiC composition to the deposition chamber; and growing a second layer of 2H-SiC film at a second rate. The first layer or the second layer of 2H-SiC contains at least 98% 2H-SiC. The first flow rate can be about 100-500 SCCM. In one embodiment, the first flow rate can be about 200 SCCM. The second flow rate can be about 200-500 SCCM.

In another embodiment, the disclosure relates to a process for producing 2H-SiC, the process comprising: depositing SiC on an AlN layer to nucleate a layer of SiC thereon; growing the 2H-SiC layer at a temperature of 1200° C. or less using one of CVD or MOCVD along with a silicon carbide precursor; wherein the 2H-SiC layer comprises 95% or more of a hexagonal SiC structure.

BRIEF DESCRIPTION OF THE DRAWINGS

These and other embodiments of the disclosure will be discussed with reference to the following exemplary and non-limiting illustrations, in which like elements are numbered similarly, and where.

DETAILED DESCRIPTION

Many commercial and military applications require high bandgap 2H-SiC. In power devices, operating temperature affects the output power of the semiconductor device. The higher the operating temperature, the higher power output can be achieved without a lifetime of failure of the semiconductor device. The lifetime failure can be the result of metal interconnect fatigue, mobile ion diffusion, or cracking or delaminating of the interconnect oxide or the overcoat oxide. Radio frequency ("RF") transceivers are designed to operate at high temperature. With 2H-SiC, RF transceivers can operate more efficiently. Because these failures are temperature dependant, a higher operating temperature decreases the mean time to failure. A high percentages of 2H-SiC in the composition overcomes this problem. Thus, the embodiments of the invention are directed to high-purity SiC, in which 2H-SiC defines about 90%, 95% or 100% of the composition.

Conventional processes for preparing SiC used physical vapor deposition at temperature range of about 1800-2100° C., which resulted in polytypes of SiC, including 4H- and 6H-SiC. The conventional methods also require high temperature processing of silicon carbide which created defects in the final product.

According to one embodiment of the invention, a high purity 2H-SiC is prepared by doping the SiC substrate or underlayer with one or more surfactants which inhibits growth of 4H-SiC or 6H-SiC. In an exemplary embodiment, the surfactant can comprise aluminum nitride ("AlN") or Tellurium ("Te"). The surfactant grains inhibit growth of the 6H-SiC because AlN(2H) will not go into solid solution in the SiC(6H) structure. Thus, 2H-SiC will grow instead of 4H-SiC or 6H-SiC. The surfactant can be combined with SiC as a solid solution and the solution can be heated to the desired temperature before 2H-SiC is grown through PVD or PVT.

In another embodiment, a thin layer of a surfactant such as AlN or Te is applied to the substrate to modify the substrate surface for a low-temperature approach to forming 2H-SiC. In this approach, a substrate is coated with a thin layer of surfactant such as AlN or Te. The surfactant modifies the substrate surface. The surfactant layer can be as thick as 600 Å. The substrate is then placed in a chamber for a two-step (nucleation and growth) deposition process. In the first step, a layer of 2H-SiC is deposited over the MN layer. During the growth and nucleation, the disc is generally in the range of 100-200 A thick and increases into thick film. In a preferred embodiment, this first layer is about 100-200 A thick. The first layer can be deposited using any conventional deposition method including CVP, CVD or MOCVD in combination with a precursor.

For the low temperature growth, the precursor can comprise one or more low temperature organosilanes including: Hexamethyldisilane (HMDS, $Si_2(CH_3)_6$) (herein, "HMDS"), tetraethylsilane (TES, $Si(C_2H_5)_4$) (herein "TES"). These precursors decompose at temperatures below 1200° C. and allow hexagonal SiC to grow over the substrate without affecting the substrate. In addition to HMDS and TES, other carbon-containing precursors can be used. These precursors include $CH_3SiH_3$, dimethylsilane $(CH_3)_2SiH_2$, and chloromethylsilane $CH_3SiH_2Cl$.

In an exemplary CVD process, a substrate having a layer of AlN is positioned in the deposition chamber and the chamber is heated to a suitable deposition temperature. While the deposition temperature can have a broad range, in one embodiment the deposition temperature is maintained below 1200° C., and preferable below 1,000° C. or 900° C. Limiting the chamber temperature will help preserve the integrity of the substrate and the AlN layer.

Once the chamber has reached the desired temperature, the precursor is introduced into the chamber. The flow rate of the precursor can be controlled in order to control nucleation and growth. In one implementation, HDMS was introduced into the deposition chamber at a rate of about 200 SCCM. In an alternative embodiment, the precursor can be introduced at a rate to enable depositing 0.1 µm of 2H-SiC per minute. The nucleation layer of AlN forces SiC to grow into hexagonal form of SiC.

Once nucleation has been completed, the semiconductor is ready for the growth step. The growth process is similar to the nucleation processes in that a precursor is used to deliver SiC in vapor form to the substrate. The precursor can be the same precursor as the precursor used in the nucleation step. Alternatively, different precursors can be used for each of the nucleation and the growth steps.

The growth step can have a faster rate than the nucleation step. In the growth step, the precursor is introduced in the deposition chamber while the substrate is heated to the deposition temperature. The deposition temperature can be maintained well below 1200° C. in order to prevent damaging the substrate or the first 2H-SiC layer. Whereas the first 2H-SiC is deposited (formed) and grown relatively slowly, the second layer can be grown at a faster rate. In a preferred embodiment, the precursor gas is introduced to the deposition chamber at about 200-500 SCCM to grow 2H-SiC layer to about micrometer thickness.

The first and the second 2H-SiC layers can be distinguished only by their deposition rate. A unitary deposition rate can be used without departing from the principles of the invention. Conversely, several different deposition rates can be implemented on a substrate to form a thick SiC layer and doped SiC layer with desired characteristics. As stated, the precursor may include a vapor containing both silicon and carbon. The precursor gas can also affect the deposition rate as a function of the percentage of silicon and/or carbon contained therein.

Figure 1:
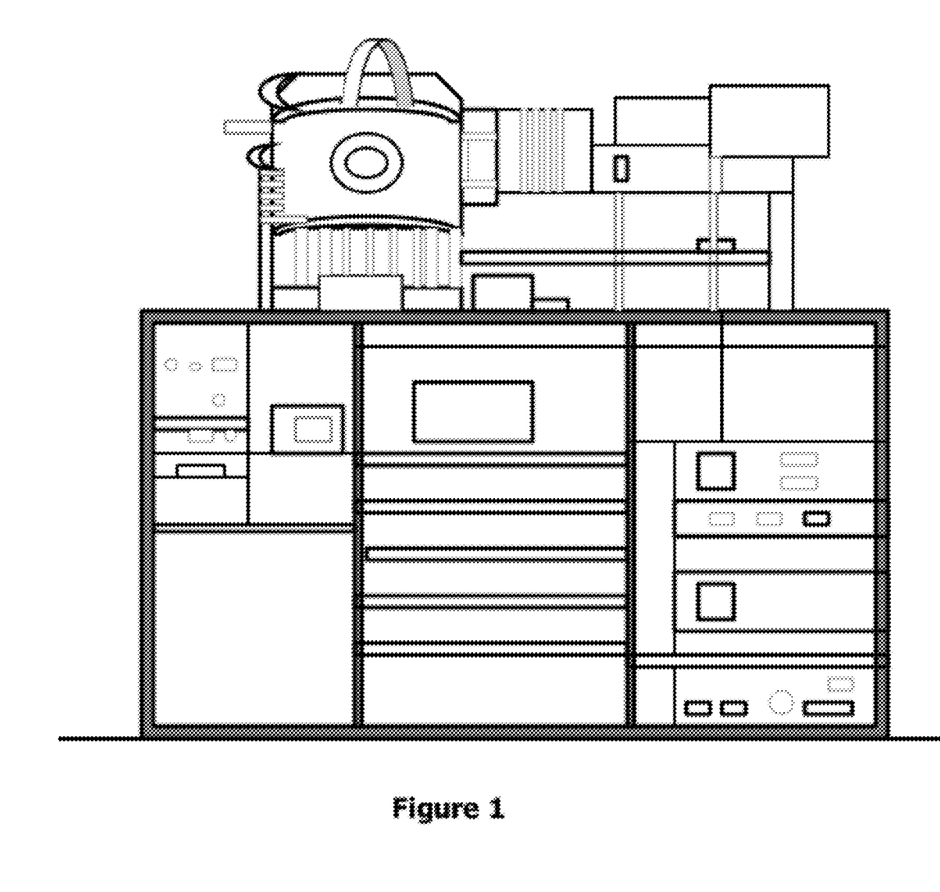
FIG. 1 shows a deposition chamber for growing substantially pure hexagonal SiC according to one embodiment of the disclosure.

FIG. 1 shows a deposition chamber for growing substantially pure hexagonal SiC according to one embodiment of the disclosure. The deposition chamber can constitute any conventional chamber configured for CVP. The deposition chamber of FIG. 1 can have an input port for communicating the precursor gas and an output port for communicating any exhaust or spent gasses. The deposition chamber may also be equipped with means for producing vacuum inside the chamber and for introducing one or more noble gasses therein.

It has been found that the presence of a surfactant such as AlN can force the SiC polytype to be purely hexagonal in nature (i.e., 2H-SiC). The presences of AlN can be in small quantities. It has also been found that the presence of Te can have the same affect on growing subsequent layers of SiC. Accordingly, an embodiment of the disclosure is directed to growing substantially pure 2H-SiC by having a quantity of Te on the substrate before nucleating SiC. The quantity of Te can be formed on a substrate as a thin film in either pure form or in combination with another substance.

Figure 2:
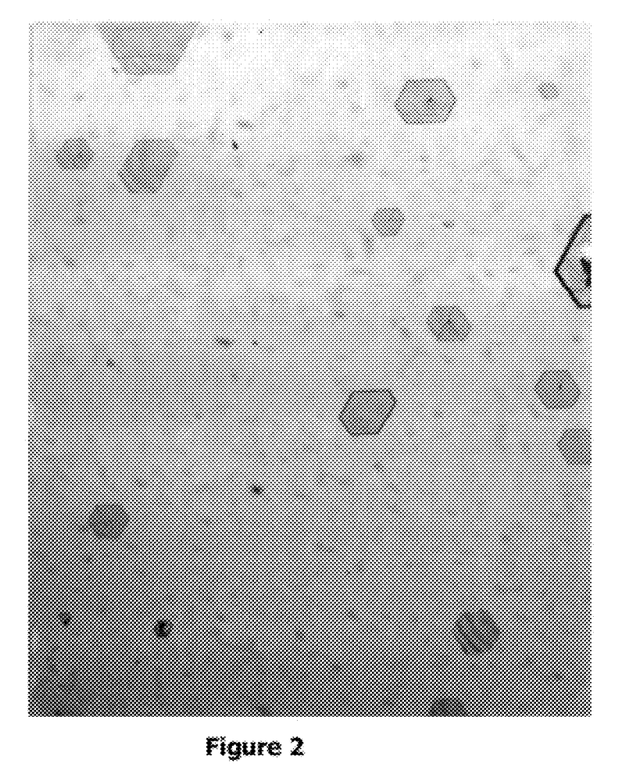
FIG. 2 shows the morphology of SiC—AlN film formed according to an embodiment of the invention.
Figure 3:
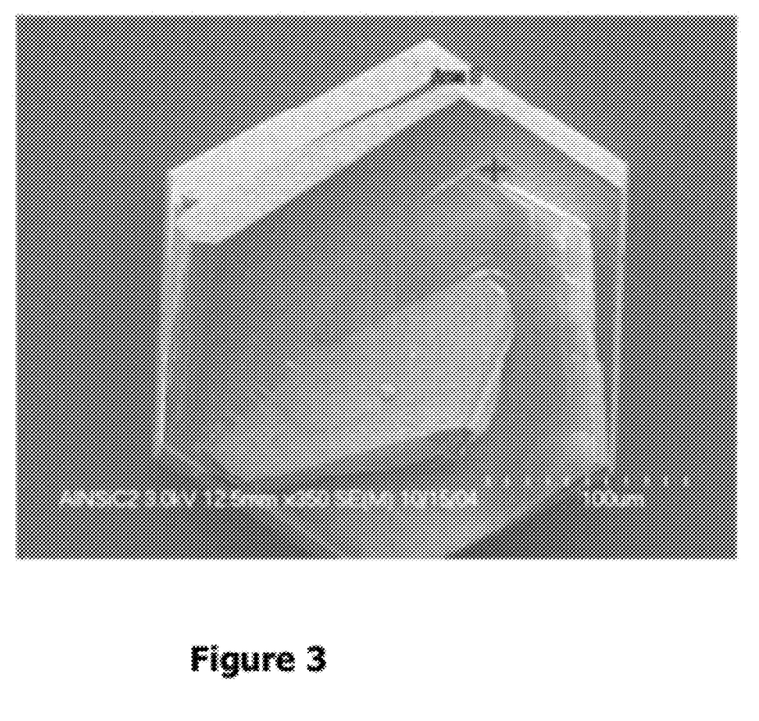
FIG. 3 shows the amplified morphology of an SiC hexagon of FIG. 2 using electron microscopy.

A layer of 2H-SiC was nucleated on a substrate supporting a thin AlN film according to the disclosed embodiments, using high temperature growing of 2H-SiC. FIG. 2 shows the morphology of SiC—AlN using electron microscopy. Specifically, FIG. 2 shows SiC grains having hexagonal shape throughout the composition. Substantially all of the SiC particles are hexagonal in form, creating a pure 2H-SiC composition. FIG. 3 shows the amplified morphology of an SiC hexagon from FIG. 2.

As stated, one or more thin layers of a surfactant can be formed on a substrate prior to depositing SiC. The surfactant modifies the surface and allow the subsequent growth of substantially pure 2H-SiC. In an exemplary implementation SiC was grown using Te as surfactant. The resulting 2H-SiC was tested and presented at FIG. 4. Specifically, FIG. 4 shows the effect of adding Te to the growth of a thin SiC layer grown using a PVD deposition technique.

Figure 4:
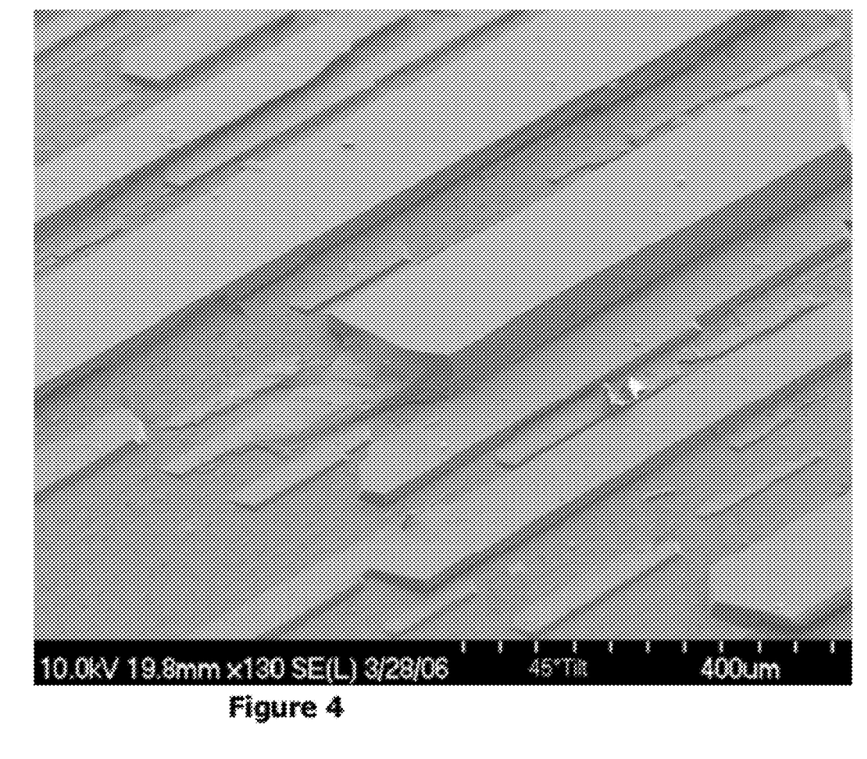
FIG. 4 shows the morphology of a layer if 2H-SiC which was grown according to an embodiment of the invention using Te as surfactant.
Figure 5:
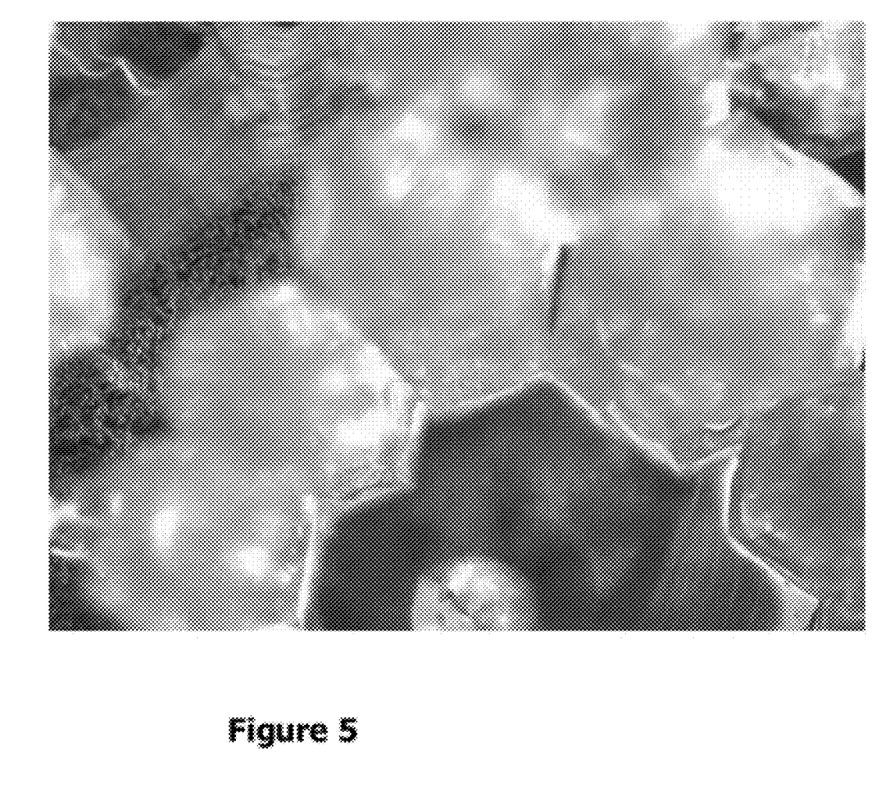
FIG. 5 shows the morphology of 2H-SiC semiconductor of FIG. 4 after completion of the growth step.

FIG. 5 shows the hexagonal layered structure of FIG. 4 after completion of the growth step. The surface morphology of FIG. 5 is similar to that shown in FIG. 4 and also suggests formation of 2H-SiC polytype. FIGS. 4 and 5 show that forming one or more thin layers of AlN and/or Te (as surfactants) on a substrate prior to depositing SiC allows subsequent growth of substantially pure 2H-SiC.

Figure 6:
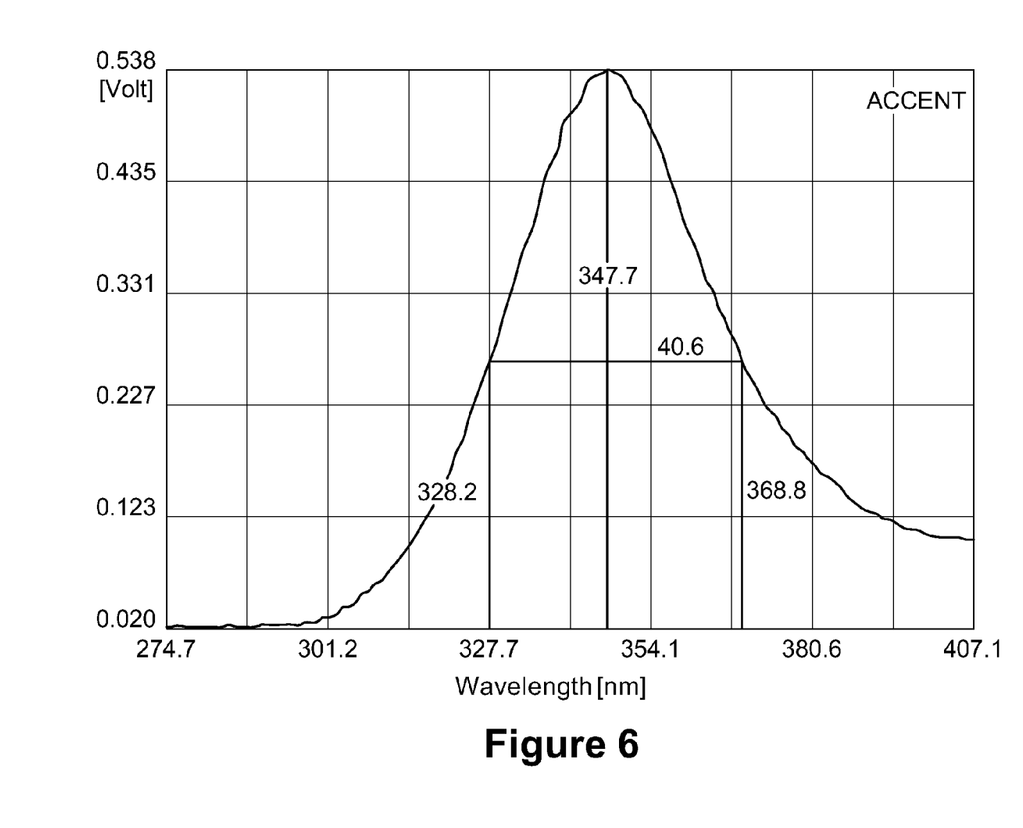
FIG. 6 shows the results of a photoluminescence (PL) emission test as applied to the SiC layer prepared for FIG. 5.

The SiC film prepared and demonstrated in FIGS. 4 and 5 were tested by exposing the 2H-SiC film to photoluminescence emissions. The results of the photoluminescence (PL) emission test is provided at FIG. 6. As shown, the peak PL occurs at about 3.56 eV which is similar to the known theoretical bandgap of 2H-SiC. The results of FIGS. 4, 5 and 6, when compared with the data of TABLE 1, confirms that the polytype SiC layer is substantially uniform hexagonal or pure 2H-SiC.

Two types of interfaces have been suggested for SiC—AlN alloys: a cation-anion bonds (e.g., Si—N, C—Al), and cation-cation and/or anion/anion bonds (e.g., C-N, Si—Al). Conventional theories suggest that cation-anion bonds may be more stable. The formation energy of the AlN/SiC interface is positive and AlN/SiC (111) and (001) junctions with long-bond interface energy have lower density of interface bonds. The abrupt AlN.SiC (111) and (001) interfaces are changed and therefore thermodynamically unstable. The charge neutrality can be restored in these systems by atomic intermixing of the interface. The simplest arrangement giving rise to neutral interfaces are those with one mixed N/C plane or Al/Si plane. AlN solid solution grains inhibit the growth of the 6H-SiC grains since AlN(2H) will not go into solid solution in the SiC(6H) structure, thereby effectively limiting growth of the 6H-SiC grains.

Figure 7:
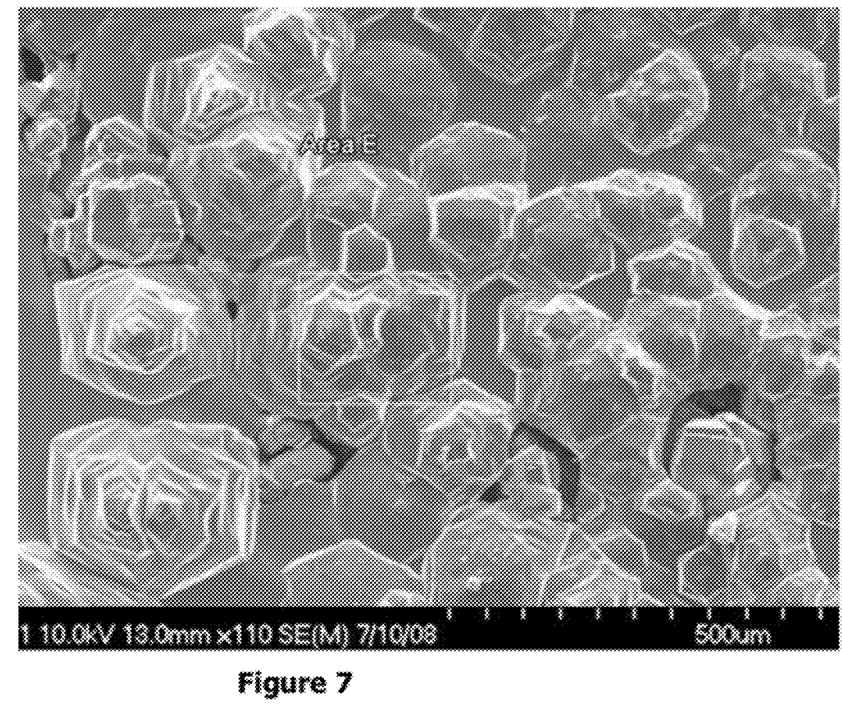
FIG. 7 shows nucleation of SiC over an MN film formed from an implementation according to one embodiment of the disclosure.
Figure 8:
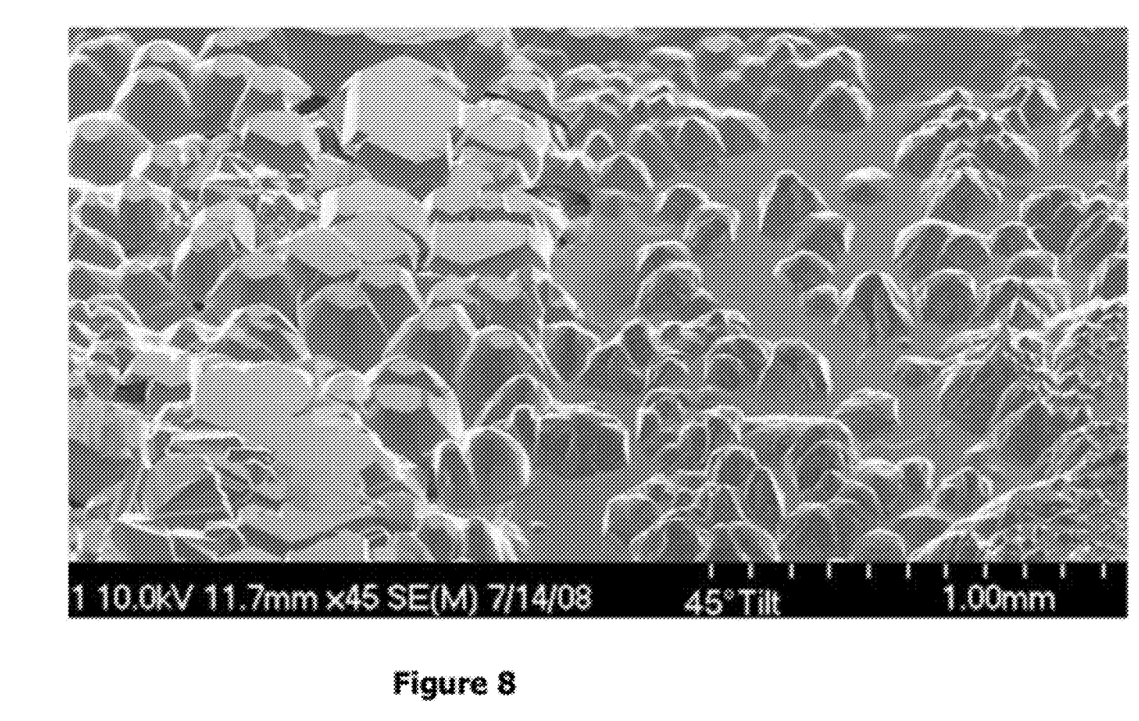
FIG. 8 shows the layer-by-layer growth of SiC hexagons of FIG. 7.

FIG. 7 shows nucleation of SiC as discs in the presence, and over a film of, AlN. The nucleation step was conducted consistent with the embodiments described above. FIG. 7 also shows the initial nucleation stage in which the grains were growing into facetted hexagons. The hexagons then grew on top of each other forming a layer-by-layer growth. No voids, bubbles or other impurities were observed. The layer-by-layer growth of SiC hexagons is shown in FIG. 8.

Figure 9:
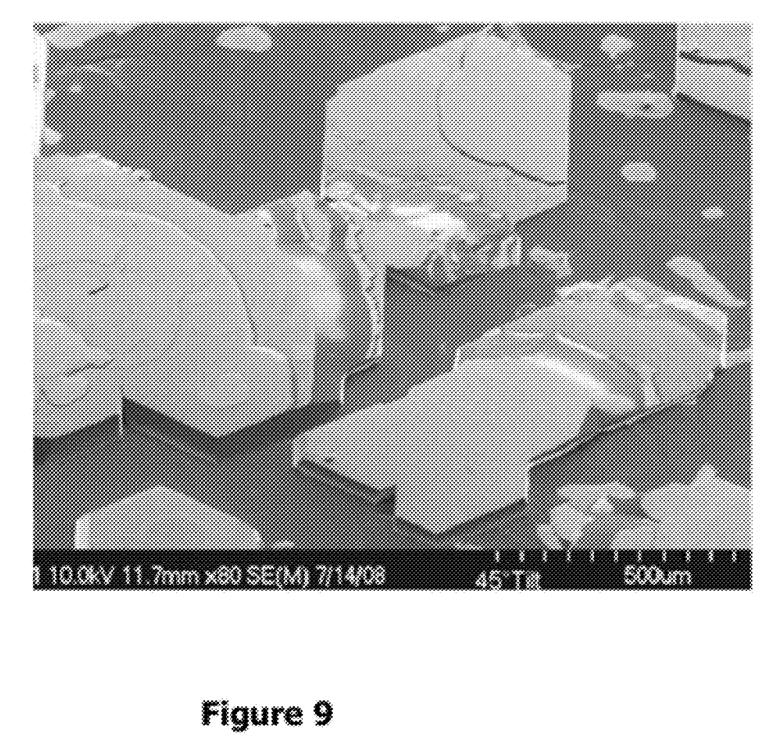
FIG. 9 shows merging of grains and growth of the 2H-SiC.

FIG. 9 is another nucleation picture showing growth of the 2H-SiC. As evident from FIG. 9, there is no tilt in the orientation of the hexagons and the grains are oriented in only one direction. As the film thickness grew, the hexagons merged together and the film started to show plane morphology. The plane of the film can be seen in FIG. 9. The growth resulted in merger of the hexagonal grains which coarsened and merged together to form centimeter-size grains.

The experimental result also indicate that SiC can be deposited on N-rich terminals followed by Wurtzite 2×2 reconstructions with N-atom. It was also determined that processing at high temperate vapor deposition changes the crystal structure for producing AlN—SiC solid solution even at low AlN concentrations.

A semiconductor's operating temperature affects its performance. The higher the temperature, the higher power output can be achieved without a lifetime failure of the semiconductor device. The lifetime failure can be a result of metal interconnect fatigue, mobile ion diffusion or cracking/delaminating of the interconnect oxide/overcoat oxide. All such failures are temperature dependant and higher operating temperatures will decrease the mean time to failure. As shown in TABLE 1, 2H-SiC provides high conductivity and high electron mobility, making this polytype particularly suitable for use in power devices. By way of example, 2H-SiC can be used for RF transmitters and receiver as well as in transceiver modulators.

Figure 10:
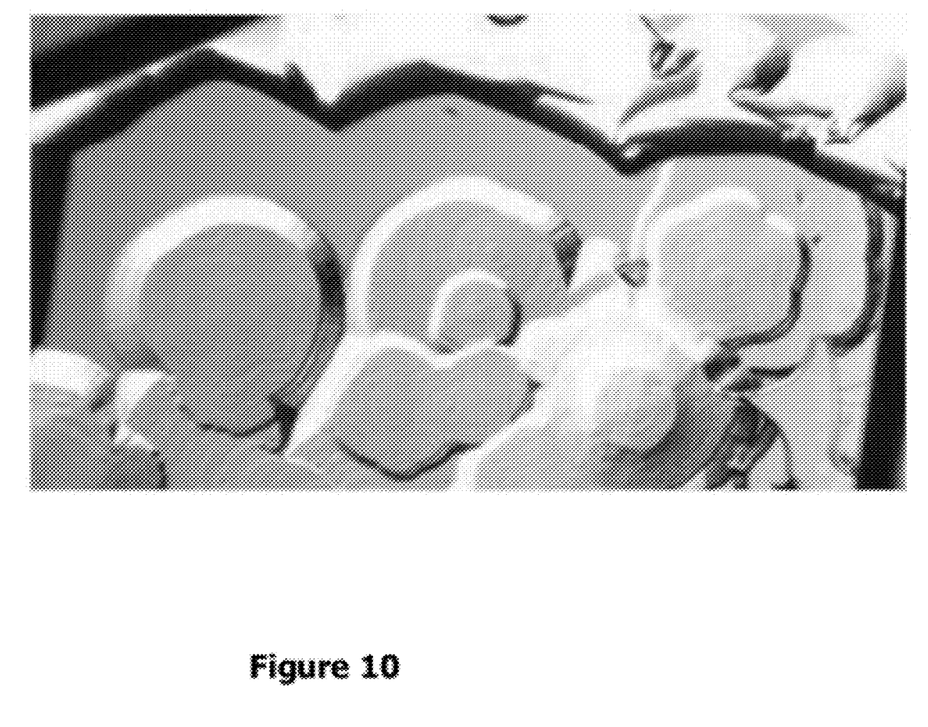
FIG. 10 shows continuous layers of SiC growing on top of each other through layer by layer growth mechanism.

Another embodiment of the disclosure relates to a method and apparatus for forming substantially pure 2H-SiC layer over other SiC polytypes without using an intermediate layer such as GaAs. According to this embodiment, MN is added in small amounts to a 4H- or 6H-SiC to nucleate hexagonal SiC at the interface and grow in Wurtzite (2H-) SiC. The subsequent layers of SiC are sublimated from the surface deposits as pyramids. The pyramids form as the normally-unstable 2H-SiC crystal type and are stabilized by AlN grains. The SiC deposits begin as discs, growing to become large area, before finally coalescing to become a continuous layer as shown in FIG. 10. Because 2H is the natural crystal orientation of AlN, the transition from 4H- to 2H-SiC aids final substrate crystal quality.

Thus, in one implementation, the invention relates to doping a layer of SiC with a suitable surfactant and growing 2H-SiC thereon. The surfactant can include AlN, Te, Antimony (Sb) or any other compound which can modify the surface to nucleate 2H-SiC.

Figure 11:
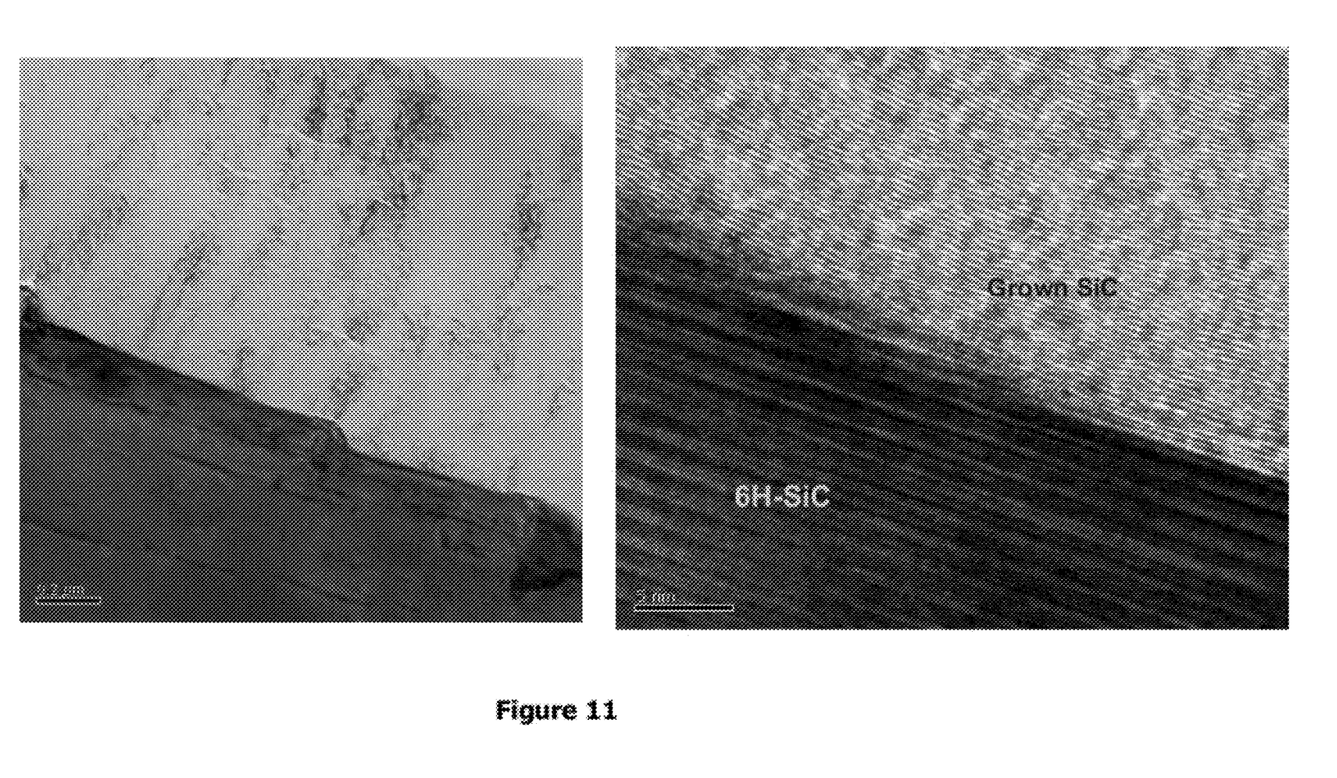
FIGS. 11A and 11B are low and high resolution transmission images of a heterostructure of 2H-SiC on 6H-SiC, respectively.

FIGS. 11A and 11B are low and high resolution transmission images of a heterostructure of 2H-SiC grown over 6H-SiC according to an embodiment of the invention. The depicted sample was prepared by introducing AlN grains to a solid solution of 6H-SiC. Thereafter a layer of 2H-SiC was grown over the 6H-SiC layer.

Figure 12:
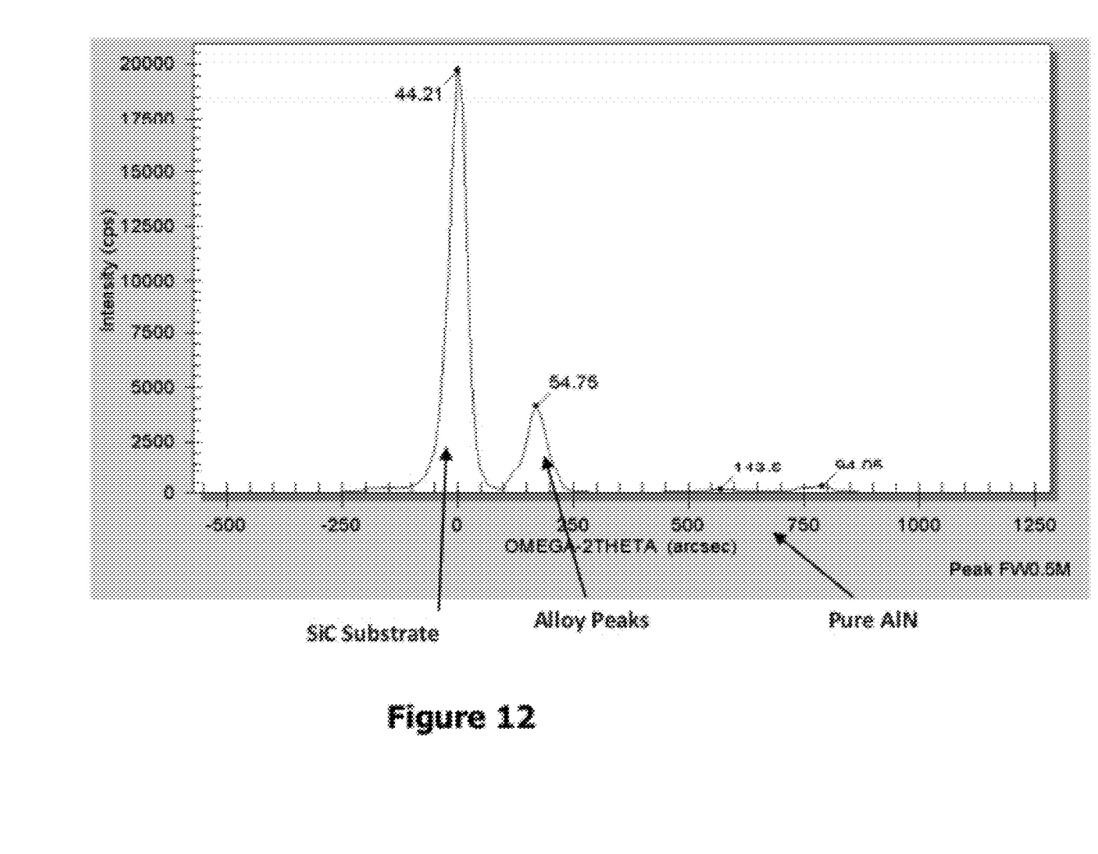
FIG. 12 shows X-ray peaks for a layer of 2H-SiC grown over a seed layer of AlN.

FIGS. 12A and 12B show the effects of Te on morphology of SiC. The sample shown in these figures was prepared by using Te grains as surfactant for a 6H-SiC layer. Thereafter, 2H-SiC was grown on 6H-SiC surface by physical vapor transport method using temperatures in the range of about 1800-2000° C. The presence of Te modified the surface of the 6H-SiC substrate and allowed nucleation of 2H-SiC. FIGS. 12A and 12B show that the presence of one or more surfactants help in nucleation into Wurtzite (2H-SiC) structure. Te was less than 1%. The presence of a surfactant such as AlN can force the SiC polytype to be purely hexagonal. The presences Te can have the same affect on growing subsequent layers of SiC. In an exemplary implementation, a substantially pure 2H-SiC layer was grown by having a quantity of Te on a substrate before nucleating SiC. The quantity of Te was formed on the substrate as a thin film. The thin film can be substantially pure or in combination with another substance. The sample was then tested. FIG. 12 shows X-ray peaks of the AlN seed layer, AlN—SiC alloy peak and pure SiC layer which was grown on the AlN seed layer.

Figure 13:
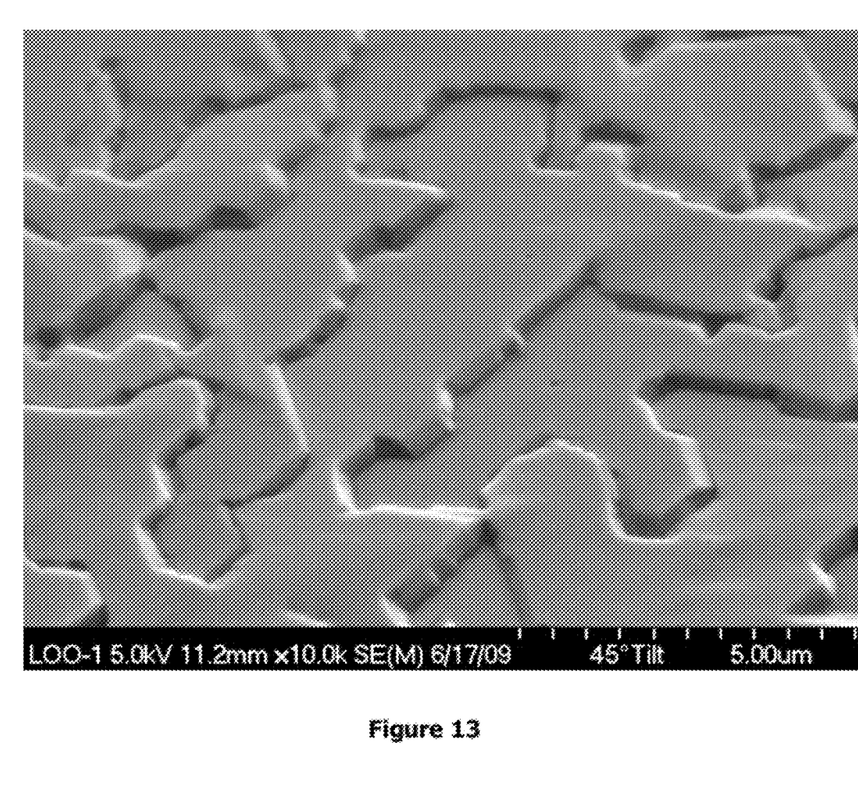
FIG. 13 shows the grown morphology by SEM which is different and does not show micropipes or other defects common to 6H- and 4H-SiC.

FIG. 13 shows the grown morphology by SEM which is different and does not show micropipes or other defects common to 6H- and 4H-SiC.

While the principles of the disclosure have been illustrated in relation to the exemplary embodiments shown herein, the principles of the disclosure are not limited thereto and include any modification, variation or permutation thereof.

What is claimed is:

1. A method for preparing 2H-SiC, the method comprising:
   depositing a layer of AlN on a silicon substrate;
   growing a first layer of 2H-SiC by disc morphology nucleation over the AlN layer by exposing the substrate to a precursor containing SiC at a first flow rate; and
   growing a second layer of 2H-SiC over the first layer by exposing the substrate to the precursor at the second flow rate;
   wherein each the first layer and the second layer is grown at temperatures of about 1200° C. or less, and
   wherein the first flow rate is about 200 SCCM and the second flow rate is about 200 to 500 SCCM.

2. The method of claim 1, wherein the substrate further comprises Si (111).

3. The method of claim 1, wherein the step of depositing a layer of AlN further comprises depositing AlN layer through one of CVD, molecular beam epitaxy ("MBE"), or Atomic layer Deposition ("ALD").

4. The method of claim 1, wherein at least one of the first layer or the second layer is deposited by a method selected form the group consisting of Chemical Vapor Deposition ("CVD") and Metal-Organic Chemical Vapor Deposition ("MOCVD").

5. The method of claim 1, wherein the AlN is deposited to a thickness of about 100-1000 Å.

6. The method of claim 1, wherein the step of growing the first layer of 2H-SiC further comprises exposing the substrate to a precursor selected from the group consisting of HMDS, TES and $C_3H_8$.

7. The method of claim 1, wherein the first thickness is less than the second thickens.

8. The method of claim 1, wherein the first thickness is about 100 Å or less.

9. The method of claim 1, wherein one of the first layer or the second layer comprises at least 98% 2H-SiC.

10. A semiconductor composition having one or more 2H-SiC layers deposited over the substrate according to the method of claim 1.

11. A silicon composition comprising a substrate, an AlN film and a layer of SiC, wherein the SiC defines pure 2H-SiC with bandgap energy of about 3.56 eV, and electron mobility of about $740 \times 10^{17}$ ($Cm^2$/Vs).

12. The silicon composition of claim 11, wherein the composition has saturated electric velocity higher than a saturated electric velocity for 4H- and 6H-SiC.

13. The silicon composition of claim 11, wherein the AlN film has a thickness of about 100 Å.

14. The silicon composition of claim 11, wherein SiC layer further comprises a first SiC layer and a second SiC layer which are deposited at different rates.

15. A semiconductor structure having a hexagonal SiC structure, the composition prepared by a process comprising the steps of:
   at a deposition chamber, depositing a first metal layer on a silicon substrate, the first layer having a material of hexagonal structure;
   heating the deposition chamber to a temperature not exceeding 1200° C.;
   providing a first precursor containing an SiC composition to the deposition chamber and growing a first layer of 2H-SiC at a first rate;
   providing a second precursor containing an SiC composition to the deposition chamber and growing a second layer of 2H-SiC film at a second rate; and wherein at least one of the first layer or the second layer of 2H-SiC contains at least 98% 2H-SiC.

16. The semiconductor structure of claim 15, wherein the composition has a breakdown voltage of about 3.4 eV or higher.

17. The semiconductor structure of claim 15, wherein the first growth rate is slower than the second growth rate.

18. The semiconductor structure of claim 15, wherein the first growth rate is substantially the same as the second growth rate.

19. The semiconductor structure of claim 15, wherein the first layer of 2H-SiC is less than 500 Å thick.

20. The semiconductor structure of claim 15, wherein the first precursor and the second precursor are selected from the group consisting of HMDS, TES and $C_3H_8$.

21. The semiconductor structure of claim 15, wherein the process further comprises introducing a noble gas into the deposition chamber.

22. The semiconductor structure of claim 15, wherein the first metal layer is selected from the group consisting of AlN and Tellurium (Te).

23. The semiconductor structure of claim 15, wherein the first layer of 2H-SiC is grown using one of Chemical Vapor Deposition ("CVD") or Metal-Oxide Chemical Vapor Deposition ("MOCVD").

24. The semiconductor structure of claim 15, wherein the first metal layer defines a layer of AlN with a thickness of about 100-1000 Å.

25. A process for producing 2H-SiC, the process comprising: depositing SiC on an AlN layer to nucleate a layer of SiC thereon; growing the 2H-SiC layer at a temperature of 1200° C. or less using one of CVD or MOCVD along with a silicon carbide precursor; wherein the 2H-SiC layer comprises more than 99% SiC structure.

26. The process of claim 25, wherein substrate comprises 100% hexagonal SiC.

27. The process of claim 25, wherein the ratio of AlN to SiC is in the range of about 2-20 wt %.

28. The process of claim 25, wherein the process is conducted at a temperature range of about 950-1250° C.

29. The process of claim 25, wherein the AlN and SiC are initially in powder form.

* * * * *